United States Patent
Wu et al.

(10) Patent No.: US 11,991,859 B2
(45) Date of Patent: May 21, 2024

(54) APPARATUS FOR DIRECT CONTACT HEAT PIPE

(71) Applicant: Dell Products L.P., Round Rock, TX (US)

(72) Inventors: Chin-Chung Wu, Taipei (TW); Chun-Han Lin, Yunlin County (TW); Che-Jung Chang, Taipei (TW); Yueh Ching Lu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 173 days.

(21) Appl. No.: 17/812,193

(22) Filed: Jul. 13, 2022

(65) Prior Publication Data

US 2024/0023280 A1    Jan. 18, 2024

(51) Int. Cl.
*H05K 7/20* (2006.01)
*G06F 1/20* (2006.01)

(52) U.S. Cl.
CPC ......... *H05K 7/20336* (2013.01); *G06F 1/206* (2013.01)

(58) Field of Classification Search
CPC ............... H01L 23/427; H01L 23/4093; H01L 2023/4087; H01L 23/40; G06F 1/20; G06F 2200/201; G06F 1/206; G06F 1/16; F28D 15/0275; F28D 15/0233; F28D 15/0266; F28D 15/04; F28D 15/02; F28D 2015/0216; H05K 7/20336; H05K 7/2039; H05K 7/20663; F28F 2013/006; B23P 2700/09
See application file for complete search history.

(56) References Cited

U.S. PATENT DOCUMENTS

| | | | | |
|---|---|---|---|---|
| 7,697,288 | B2 * | 4/2010 | Okutsu ................... | G06F 1/203 174/15.2 |
| 8,395,898 | B1 * | 3/2013 | Chamseddine ....... | F28D 7/0075 361/695 |
| 2004/0070933 | A1 * | 4/2004 | Sarraf ................... | H01L 23/427 257/E23.088 |
| 2004/0201958 | A1 * | 10/2004 | Lev ....................... | H01L 23/467 361/679.48 |
| 2007/0236887 | A1 * | 10/2007 | Cheng ................... | H01L 23/427 257/E23.084 |
| 2009/0009971 | A1 * | 1/2009 | Chung ................ | H01L 23/4006 361/704 |
| 2009/0040728 | A1 * | 2/2009 | Chen ................... | H01L 23/4006 361/709 |
| 2010/0002394 | A1 * | 1/2010 | Chen ..................... | H01L 23/427 361/700 |

(Continued)

*Primary Examiner* — Michael A Matey
(74) *Attorney, Agent, or Firm* — McDermott Will & Emery LLP

(57) ABSTRACT

An apparatus may include a heat pipe with a first portion residing in a first plane, a second portion residing in the first plane and a third portion positioned between the first portion and the second portion, the third portion residing in a second plane spaced-apart from the first plane. The apparatus further includes a base plate including an opening and a clip plate having a first region, a second region and a third region positioned between the first and the second regions. The third portion of the heat pipe is positioned within the opening, and the clip plate is coupled to the base plate such that i) the third region of the clip plate is in superimposition with the third portion of the heat pipe and ii) third region of the clip plate resides in the first plane.

18 Claims, 10 Drawing Sheets

(56) References Cited

U.S. PATENT DOCUMENTS

| | | | | |
|---|---|---|---|---|
| 2010/0177477 | A1* | 7/2010 | Cheng | H01L 23/427 361/679.46 |
| 2010/0236756 | A1* | 9/2010 | Yang | F28D 15/0275 165/80.3 |
| 2012/0293958 | A1* | 11/2012 | Lee | H05K 7/20336 165/104.26 |
| 2013/0087311 | A1* | 4/2013 | Lee | F28D 15/02 165/67 |
| 2013/0126125 | A1* | 5/2013 | Wang | F28D 15/0233 165/67 |
| 2013/0168058 | A1* | 7/2013 | Chamseddine | F28D 7/0075 165/104.26 |
| 2013/0186599 | A1* | 7/2013 | Chen | F28D 15/0233 29/890.032 |
| 2014/0182817 | A1* | 7/2014 | Yu | F28D 15/0275 165/104.21 |
| 2014/0321058 | A1* | 10/2014 | Fujieda | F28D 15/0233 29/890.032 |
| 2015/0043167 | A1* | 2/2015 | Guenin | H01L 23/427 361/719 |
| 2015/0192369 | A1* | 7/2015 | Rivera | G06F 1/20 165/104.19 |
| 2015/0330715 | A1* | 11/2015 | Yu | F28D 15/0233 29/890.03 |
| 2017/0252878 | A1* | 9/2017 | Lin | B23P 15/26 |
| 2019/0104608 | A1* | 4/2019 | Laurent | H01L 23/40 |
| 2020/0089292 | A1* | 3/2020 | North | G06F 1/206 |
| 2020/0337178 | A1* | 10/2020 | Paavola | H05K 7/2039 |
| 2021/0015007 | A1* | 1/2021 | Watanabe | H05K 7/20481 |
| 2021/0136956 | A1* | 5/2021 | Paavola | F28D 15/04 |
| 2022/0369512 | A1* | 11/2022 | Kitamura | H01L 23/4006 |
| 2023/0019710 | A1* | 1/2023 | Tsen | G06F 1/203 |
| 2023/0035904 | A1* | 2/2023 | McKittrick | H01M 10/6563 |
| 2023/0228498 | A1* | 7/2023 | Huang | F28D 15/0275 165/104.26 |

* cited by examiner

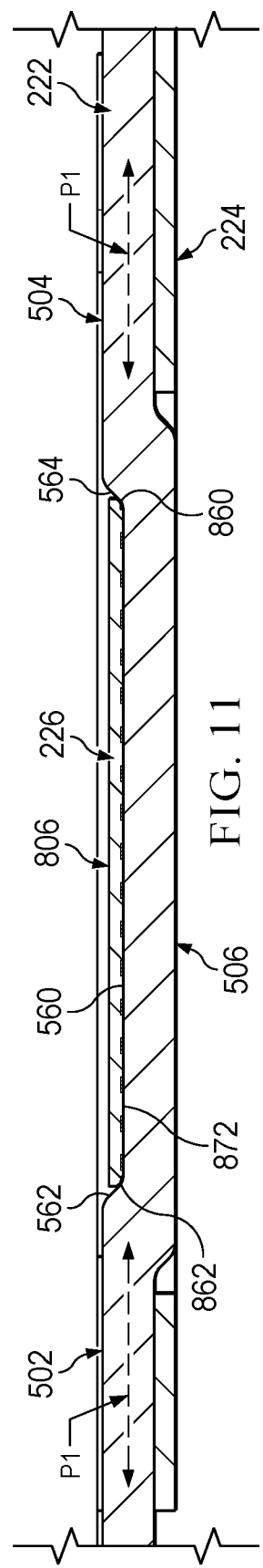

APPARATUS FOR DIRECT CONTACT HEAT PIPE

BACKGROUND

Field of the Disclosure

The disclosure relates generally to an information handling system, and in particular, an apparatus for a direct contact heat pipe of the information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY

Innovative aspects of the subject matter described in this specification may be embodied in apparatus comprising a heat pipe. The heat pipe includes a first portion residing in a first plane; a second portion residing in the first plane; a third portion positioned between the first portion and the second portion, the third portion residing in a second plane spaced-apart from the first plane; a base plate including an opening; a clip plate including a first region, a second region, and a third region positioned between the first and the second regions. The third portion of the heat pipe is positioned within the opening and the clip plate is coupled to the base plate such that i) the third region of the clip plate is in superimposition with the third portion of the heat pipe and ii) third region of the clip plate resides in the first plane.

Other embodiments of these aspects include corresponding systems and apparatus. These and other embodiments may each optionally include one or more of the following features. For instance, in some embodiments, the heat pipe has a first width, wherein the opening has a second width, wherein the second width of the opening is substantially the same as the first width of the heat pipe. In some embodiments, the third region of the clip plate extends a third width between the first region and the second region, wherein the third width is substantially the same as the second width of the opening. In some embodiments, the third portion of the heat pipe has a first length between the first portion and the second portion, wherein the opening has a second length, wherein the second length of the opening is substantially the same as the first length of the third portion of the heat pipe. In some embodiments, the third region of the clip plate has a third length, wherein the third length is substantially the same as the second length of the opening. In some embodiments, the heat pipe further comprises a first angled portion positioned between the first portion and the third portion and a second angled portion positioned between the second portion and the third portion. In some embodiments, the clip plate further comprises a first connecting region positioned between the first region and the third region and a second connecting region positioned between the second region and the third region. In some embodiments, the clip plate is riveted to the base plate. In some embodiments, the clip plate is screw mounted to the base plate.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 11 illustrates a side cut-away view of the clip plate coupling the heat pipe to the base plate.

DESCRIPTION OF PARTICULAR EMBODIMENT(S)

Figure 1:
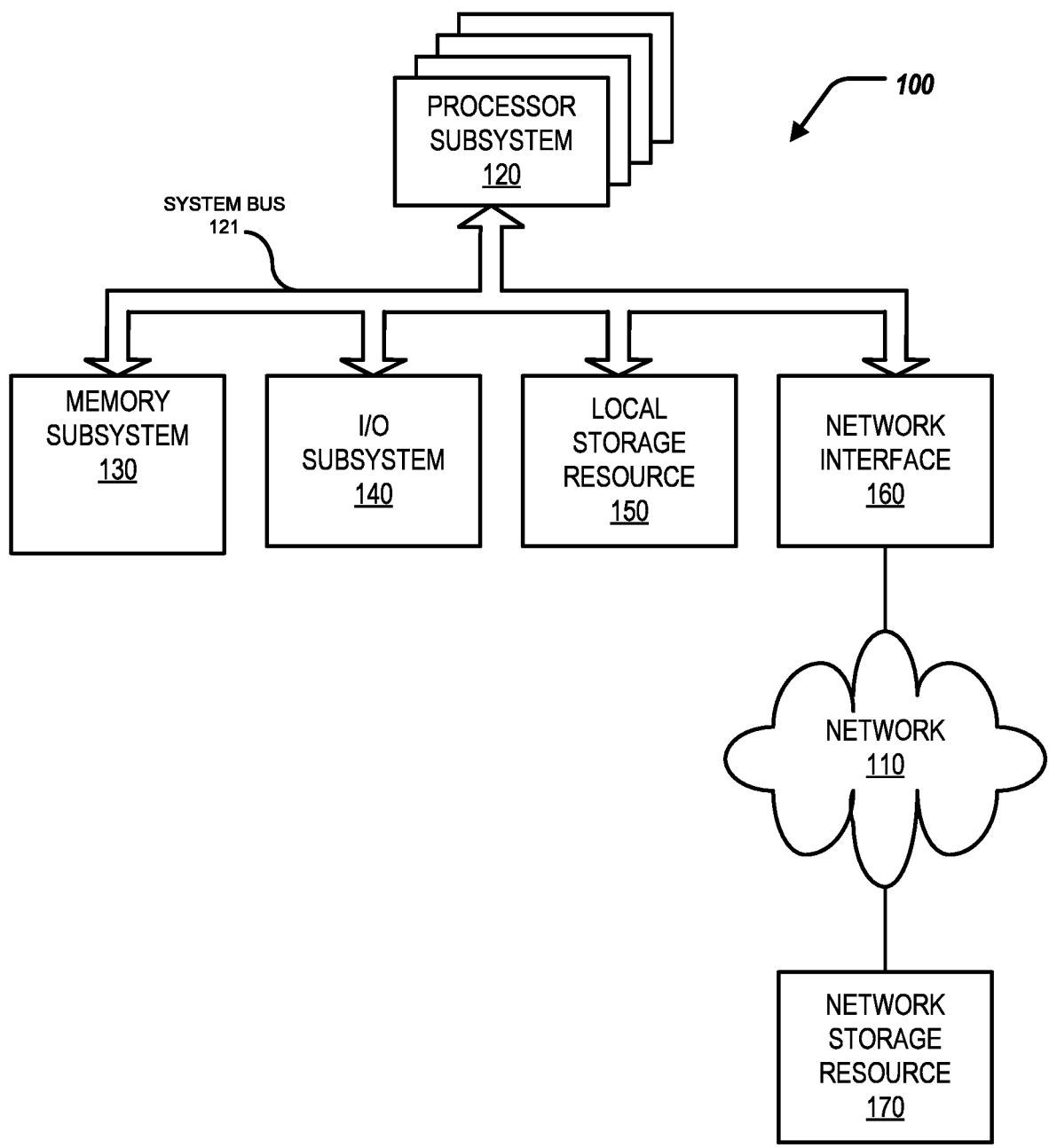
FIG. 1 is a block diagram of selected elements of an embodiment of an information handling system.

This disclosure discusses an apparatus for a direct contact heat pipe of an information handling system. Specifically, this disclosure discusses an apparatus comprising: a heat pipe, the heat pipe including: a first portion residing in a first plane; a second portion residing in the first plane; a third portion positioned between the first portion and the second portion, the third portion residing in a second plane spaced-apart from the first plane; a base plate including an opening; a clip plate, including: a first region; a second region; and a third region positioned between the first and the second regions; wherein the third portion of the heat pipe is positioned within the opening, and wherein the clip plate is coupled to the base plate such that i) the third region of the clip plate is in superimposition with the third portion of the heat pipe and ii) third region of the clip plate resides in the first plane.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-11 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
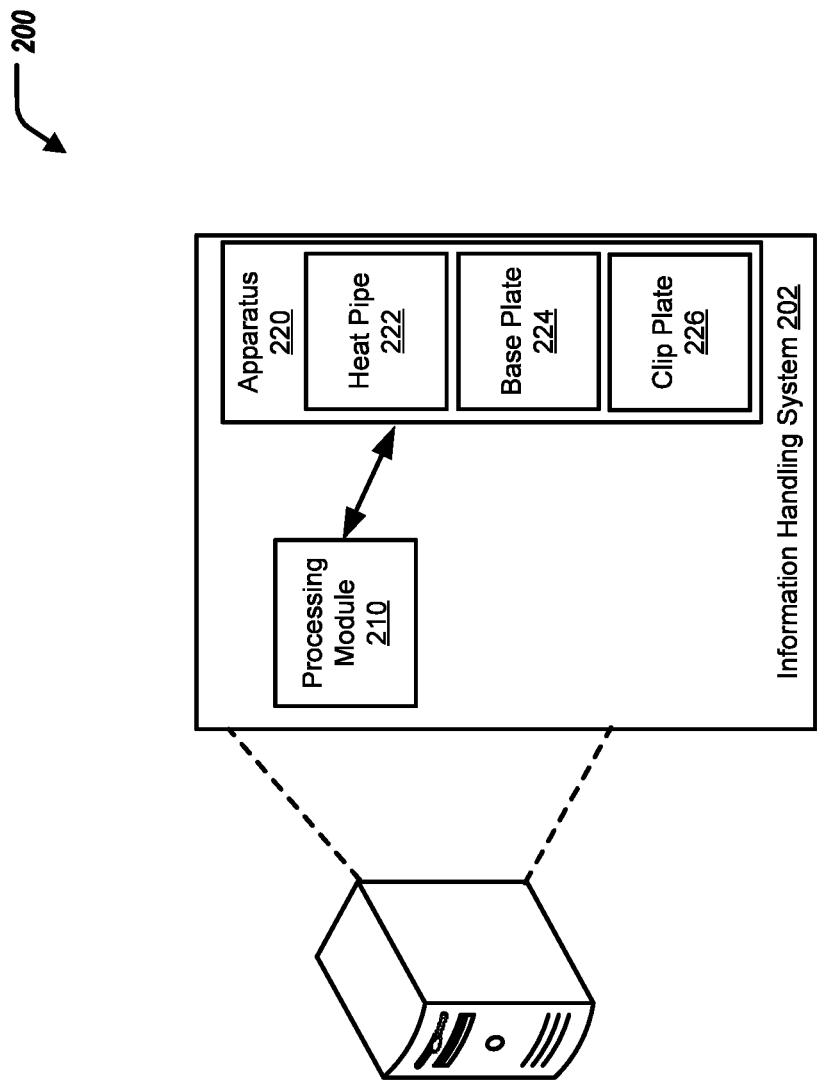
FIG. 2 illustrates a block diagram of the information handling system.

Turning to FIG. 2, FIG. 2 illustrates an environment 200 including an information handling system 202. The information handling system 202 can include a processing module 210, and an apparatus 220. In some examples, the information handling system 202 is similar to, or includes, the information handling system 100 of FIG. 1. In some examples, the processing module 210 is the same, or substantially the same, as the processor subsystem 120 of FIG. 1.

The processing module 210 can be in contact with the apparatus 220.

The apparatus 220 can include a heat pipe 222, a base plate 224, and a clip plate 226. The clip plate 226 can couple the heat pipe 222 to the base plate 224, as described further herein. The apparatus 220 can transfer heat created by or near the processing module 210 to another place (to facilitate controlling a temperature of the processing module 210).

Figure 3:
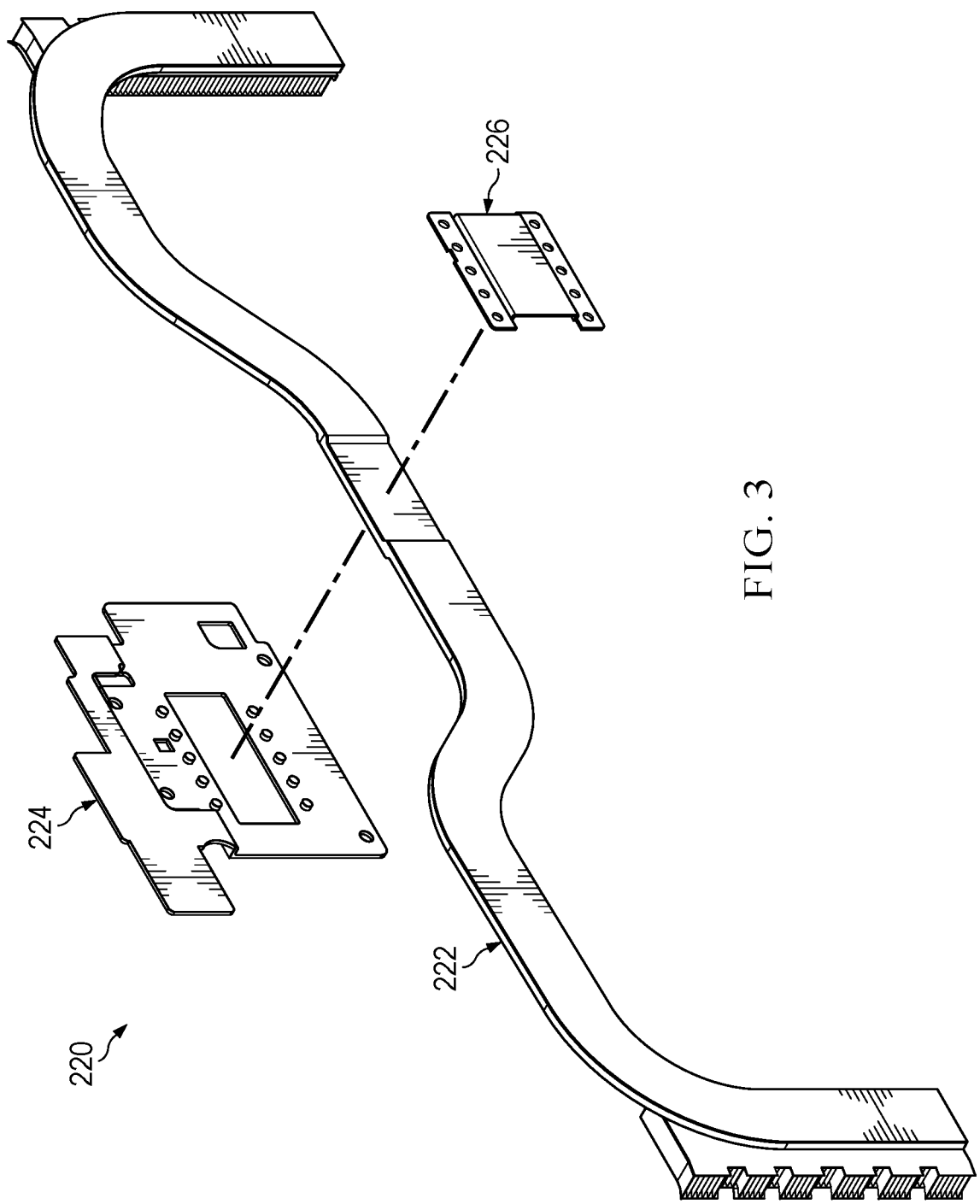
FIG. 3 illustrates a perspective exploded view of an apparatus, including a heat pipe, a base plate, and a clip plate.

FIG. 3 illustrates a perspective exploded view of the apparatus 220, including the heat pipe 222, the base plate 224, and the clip plate 226.

Figure 4:
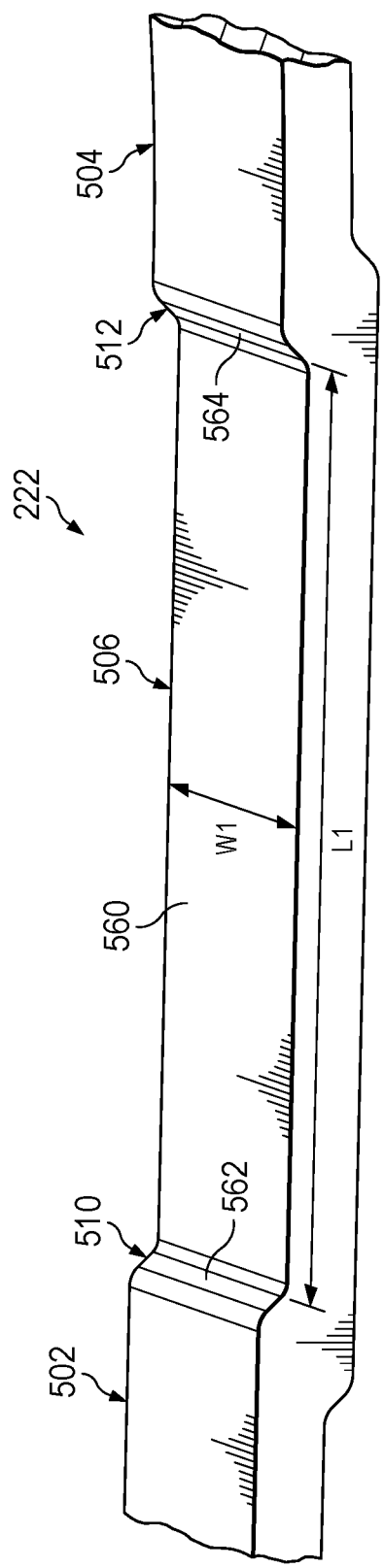
FIG. 4 illustrates a perspective view of a portion of the heat pipe.
Figure 5:
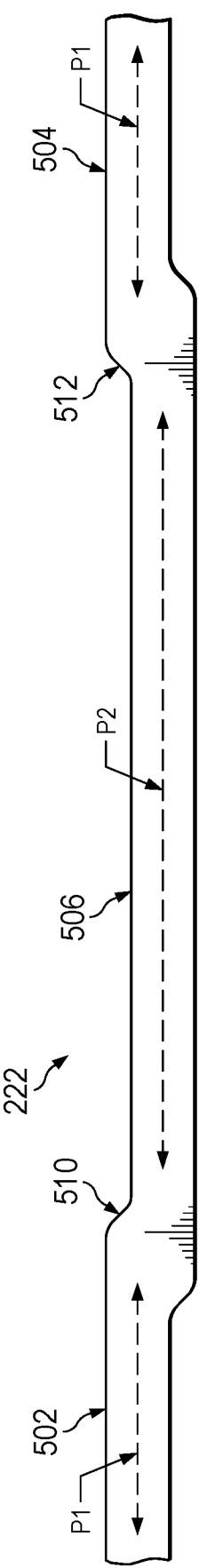
FIG. 5 illustrates a side view of the heat pipe.

FIG. 4 illustrates a perspective view of a portion of the heat pipe 222, and FIG. 5 illustrates a side view of the heat pipe 222.

Referring to FIGS. 4 and 5, the heat pipe 222 can include a first portion 502, a second portion 504, and a third portion 506. The third portion 506 is positioned between the first portion 502 and the third portion 506. The first portion 502 and the second portion 504 reside in a first plane P1. The third portion 506 resides in a second plane P2. The second plane P2 is spaced-apart from the first plane P1.

The heat pipe 222 can further include a first angled portion 510 and a second angled portion 512. The first angled portion 510 is positioned between the first portion 502 and the third portion 506. The second angled portion 512 is positioned between the second portion 504 and the third portion 506.

The heat pipe 222 has a first width W1. Furthermore, the third portion 506 of the heat pipe 222 has a first length L1 between the first portion 502 and the second portion 504.

The third portion 506 of the heat pipe 222 can further include a top surface 560.

The first angled portion 510 can include an angled surface 562. The second angled portion 512 can include an angled surface 564.

Figure 6:
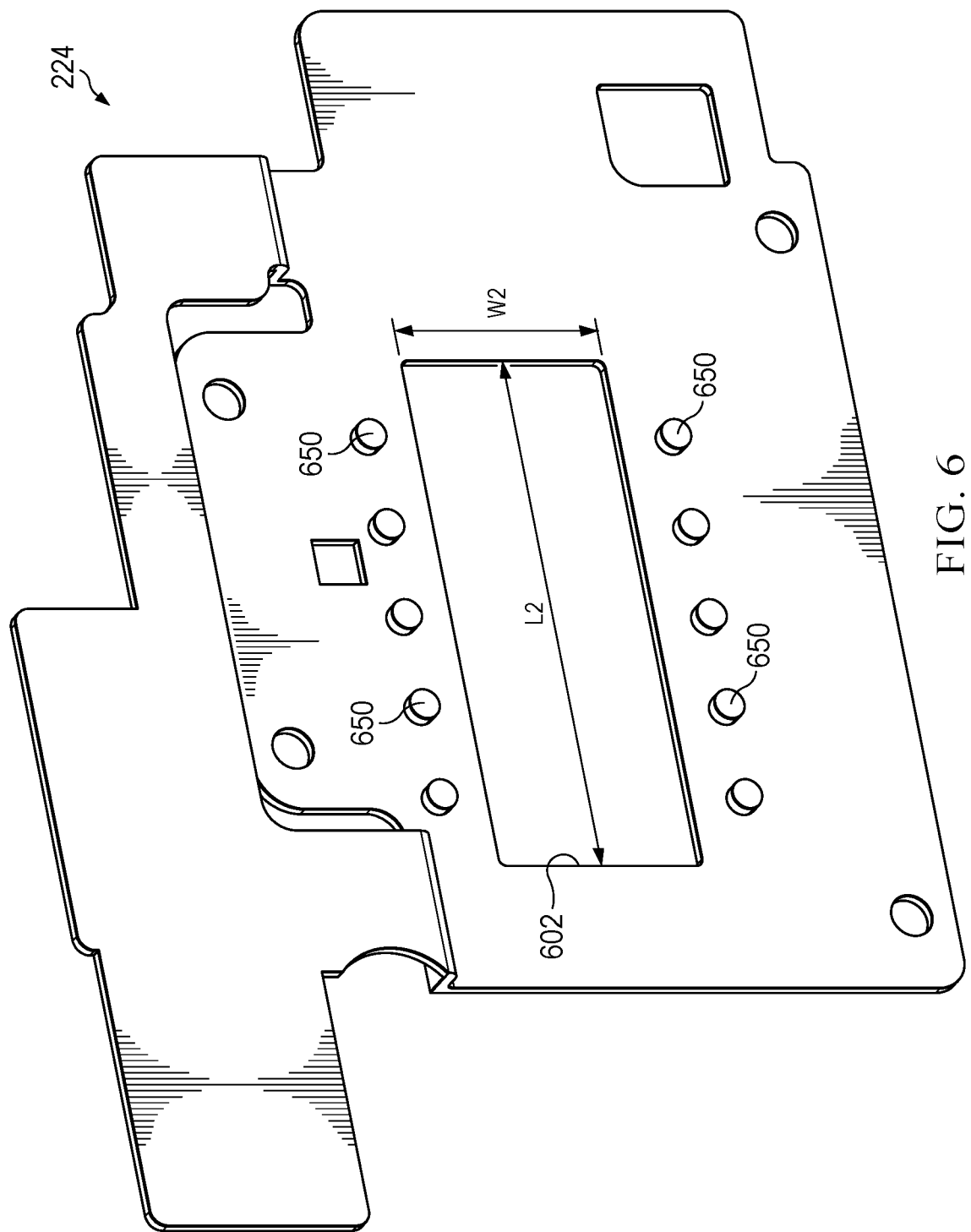
FIG. 6 illustrates a perspective view of the base plate.

FIG. 6 illustrates a perspective view of the base plate 224. The base plate 224 can include an opening 602. The opening 602 has a second width W2. The second width W2 of the opening 602 can be substantially the same as the first width W1 of the heat pipe 222 (as shown in FIG. 4). The opening 602 has a second length L2. The second length L2 of the opening 602 can be substantially the same as the first length L1 of the third portion 506 of the heat pipe 222 (as shown in FIG. 4).

The base plate 224 can further include protrusions 650.

Figure 7:
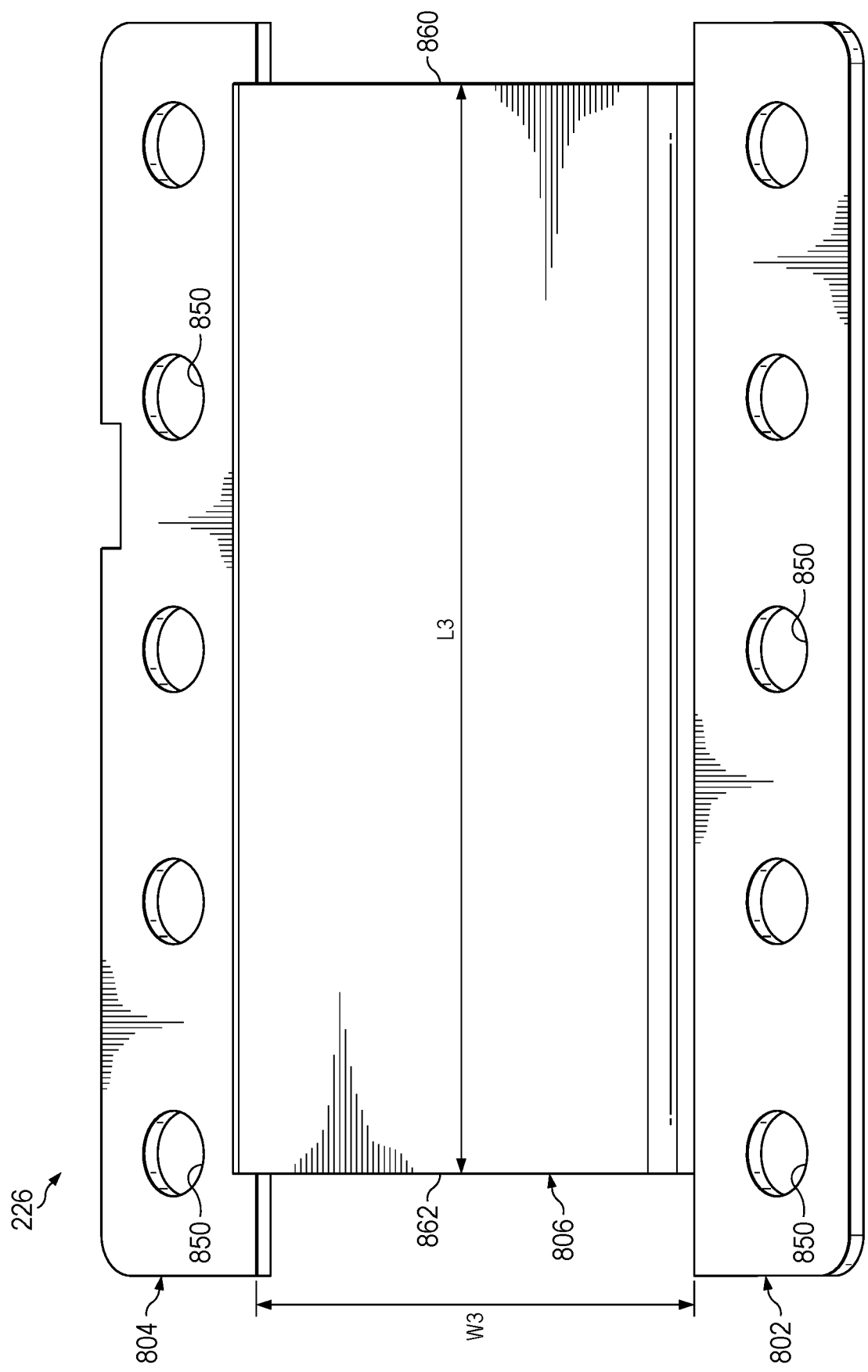
FIG. 7 illustrates a perspective view of the clip plate.
Figure 8:
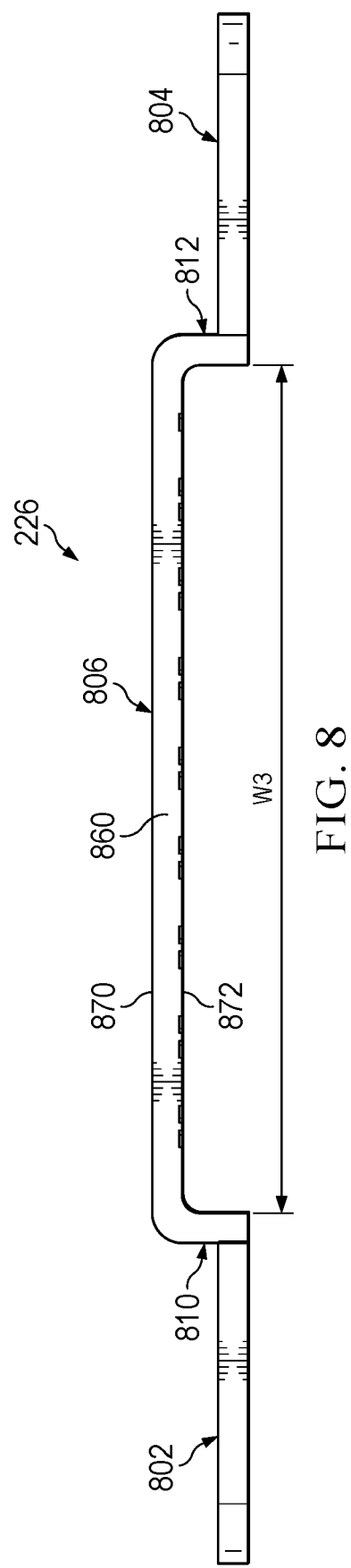
FIG. 8 illustrates a side view of the clip plate

FIG. 7 illustrates a perspective view of the clip plate 226; and FIG. 8 illustrates a side view of the clip plate 226.

Referring to FIGS. 7 and 8, the clip plate 226 can include a first region 802, a second region 804, and a third region 806. The third region 806 is positioned between the first region 802 and the second region 804.

The clip plate 226 can further include a first connecting region 810 and a second connecting region 812. The first connecting region 810 is positioned between the first region 802 and the third region 806. The second connecting region 812 is positioned between the second region 804 and the third region 806.

The third region 806 of the clip plate 226 can include a first surface 860 and a second surface 862.

The third region 806 of the clip plate 226 can further include a top surface 870 and a bottom surface 872.

The third region 806 of the clip plate 226 extends a third width W3 between the first region 802 and the second region 804. The third width W3 is substantially the same as the second width W3 of the opening 602 (as shown in FIG. 6). The third width W3 is substantially the same as the first width W1 of the heat pipe 222 (as shown in FIG. 4).

The third region 806 of the clip plate 226 has a third length L3 between the first surface 860 and the second surface 862. The third length L3 is substantially the same as the second length L2 of the opening 602 (as shown in FIG. 6). The third length L3 is substantially the same as the first length L1 of the third portion 506 of the heat pipe 222 (as shown in FIG. 4).

The clip plate 226 can further include a plurality of holes 850 positioned on the first region 802 and the second region 804.

Figure 9:
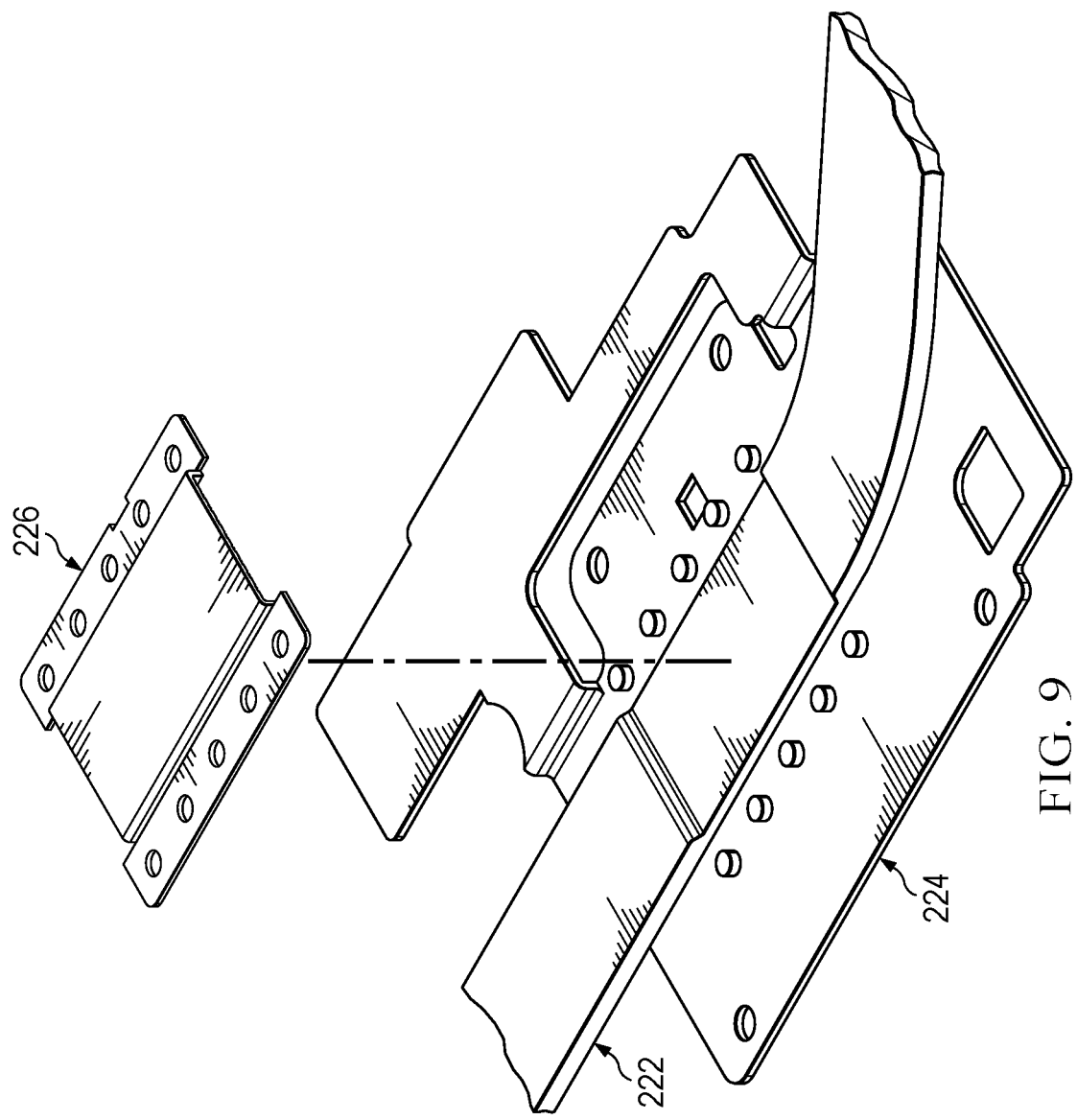
FIG. 9 illustrates the heat pipe proximate to the base plate.

FIG. 9 illustrates the heat pipe 222 proximate to the base plate 224, and prior to coupling of the heat pipe 222 to the base plate 224 by the clip plate 226.

Figure 10:
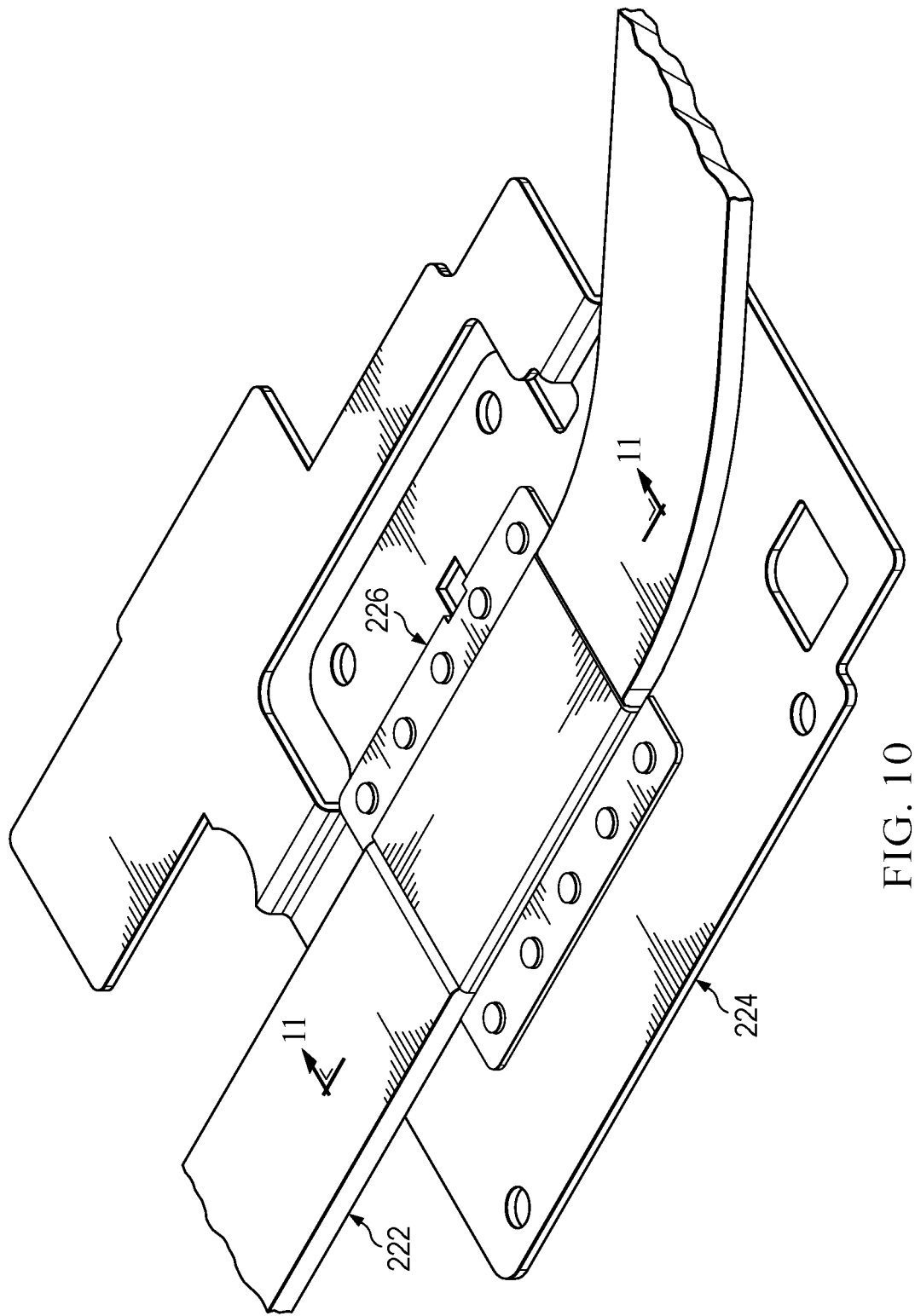
FIG. 10 illustrates a perspective view of the clip plate coupling the heat pipe to the base plate.

FIG. 10 illustrates a perspective view of the clip plate 226 coupling the heat pipe 222 to the base plate 224; and FIG. 11 illustrates a side cut-away view of the clip plate 226 coupling the heat pipe 222 to the base plate 224.

Specifically, the third portion 506 of the heat pipe 222 is positioned within the opening 602 (shown in FIG. 6) of the base plate 224. Furthermore, the clip plate 226 is coupled to the base plate 224 such that the third region 806 of the clip plate 226 is in superimposition with the third portion 506 of the heat pipe 222. Moreover, the clip plate 226 is coupled to the base plate 224 such that the third region 806 of the clip plate 226 resides in the first plane P1 of the first region 802 and the second region 804 of the heat pipe 222.

Further, the third portion 506 of the heat pipe 222 is positioned between the first portion 502 and the second portion 504 of the heat pipe 222.

Further, when the clip plate 226 is coupled to the base plate 224, the bottom surface 872 of the third region 806 of the clip plate 226 can contact the top surface 560 of the third portion 506 of the heat pipe 222. Further, when the clip plate 226 is coupled to the base plate 224, the first surface 860 of the third region 806 of the clip plate 226 contacts the angled surface 562 of the first angled portion 510 of the heat pipe 222 and the second surface 862 of the third region 806 of the clip plate 226 contacts the angled surface 564 of the second angled portion 512 of the heat pipe 222.

The clip plate 226 can couple the heat pipe 222 to the base plate 224 by riveting the clip plate 226 to the base plate 224. That is, the protrusions 650 of the base plate 224 can be positioned within the holes 850 of the clip plate 226, and rivetted together. In some examples, the clip plate 226 is screw mounted to the base plate 224.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An apparatus, comprising:
   a heat pipe, the heat pipe including:
      a first portion residing in a first plane;
      a second portion residing in the first plane;
      a third portion positioned between the first portion and the second portion, the third portion residing in a second plane spaced-apart from the first plane;
   a base plate including an opening;
   a clip plate, including:
      a first region;
      a second region; and
      a third region positioned between the first and the second regions;
   wherein the third portion of the heat pipe is positioned within the opening, and
   wherein the clip plate is coupled to the base plate such that i) the third region of the clip plate is in superimposition with the third portion of the heat pipe and ii) third region of the clip plate resides in the first plane.

2. The apparatus of claim 1, wherein the heat pipe has a first width, wherein the opening has a second width, wherein the second width of the opening is substantially the same as the first width of the heat pipe.

3. The apparatus of claim 2, wherein the third region of the clip plate extends a third width between the first region and the second region, wherein the third width is substantially the same as the second width of the opening.

4. The apparatus of claim 3, wherein the third portion of the heat pipe has a first length between the first portion and the second portion, wherein the opening has a second length, wherein the second length of the opening is substantially the same as the first length of the third portion of the heat pipe.

5. The apparatus of claim 4, wherein the third region of the clip plate has a third length, wherein the third length is substantially the same as the second length of the opening.

6. The apparatus of claim 1, the heat pipe further comprising:
   a first angled portion positioned between the first portion and the third portion; and
   a second angled portion positioned between the second portion and the third portion.

7. The apparatus of claim 1, the clip plate further including:
   a first connecting region positioned between the first region and the third region; and
   a second connecting region positioned between the second region and the third region.

8. The apparatus of claim 1, wherein the clip plate is riveted to the base plate.

9. The apparatus of claim 1, wherein the clip plate is screw mounted to the base plate.

10. An information handling system, comprising:
    a processing module;
    memory media storing instructions executable by the processing module to perform operations;
    an apparatus coupled to the processing module to transfer heat from the processing module, including:
       a heat pipe, the heat pipe including:
          a first portion residing in a first plane;
          a second portion residing in the first plane;

a third portion positioned between the first portion and the second portion, the third portion residing in a second plane spaced-apart from the first plane;

a base plate including an opening;

a clip plate, including:
   a first region;
   a second region; and
   a third region positioned between the first and the second regions;

wherein the third portion of the heat pipe is positioned within the opening, and wherein the clip plate is coupled to the base plate such that i) the third region of the clip plate is in superimposition with the third portion of the heat pipe and ii) third region of the clip plate resides in the first plane.

11. The information handling system of claim 10, wherein the heat pipe has a first width, wherein the opening has a second width, wherein the second width of the opening is substantially the same as the first width of the heat pipe.

12. The information handling system of claim 11, wherein the third region of the clip plate extends a third width between the first region and the second region, wherein the third width is substantially the same as the second width of the opening.

13. The information handling system of claim 12, wherein the third portion of the heat pipe has a first length between the first portion and the second portion, wherein the opening has a second length, wherein the second length of the opening is substantially the same as the first length of the third portion of the heat pipe.

14. The information handling system of claim 13, wherein the third region of the clip plate has a third length, wherein the third length is substantially the same as the second length of the opening.

15. The information handling system of claim 10, the heat pipe further comprising:
   a first angled portion positioned between the first portion and the third portion; and
   a second angled portion positioned between the second portion and the third portion.

16. The information handling system of claim 10, the clip plate further including:
   a first connecting region positioned between the first region and the third region; and
   a second connecting region positioned between the second region and the third region.

17. The information handling system of claim 10, wherein the clip plate is riveted to the base plate.

18. The information handling system of claim 10, wherein the clip plate is screw mounted to the base plate.

\* \* \* \* \*